(12) United States Patent
Park et al.

(10) Patent No.: US 11,557,477 B2
(45) Date of Patent: Jan. 17, 2023

(54) APPARATUS FOR TREATING SUBSTRATE

(71) Applicant: SEMES CO., LTD., Cheonan-si (KR)

(72) Inventors: Min Jung Park, Daegu (KR);
Kyungjin Seo, Asan-si (KR);
Younghun Jung, Asan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 298 days.

(21) Appl. No.: 16/896,535

(22) Filed: Jun. 9, 2020

(65) Prior Publication Data

US 2020/0388494 A1 Dec. 10, 2020

(30) Foreign Application Priority Data

Jun. 10, 2019 (KR) ........................ 10-2019-0068197

(51) Int. Cl.
*H01L 21/033* (2006.01)
*H01L 21/67* (2006.01)
*B01J 35/00* (2006.01)

(52) U.S. Cl.
CPC ........ *H01L 21/0332* (2013.01); *B01J 35/004* (2013.01); *H01L 21/67017* (2013.01); *H01L 21/67115* (2013.01)

(58) Field of Classification Search
CPC ........... H01L 21/0332; H01L 21/67017; H01L 21/67115; H01L 21/67103; H01L 21/6719; H01L 21/67748; H01L 21/68707; H01L 21/67178; H01L 21/67098; H01L 21/67772; B01J 35/004; G03F 7/38; G03F 7/20
See application file for complete search history.

(56) References Cited

FOREIGN PATENT DOCUMENTS

| | | | |
|---|---|---|---|
| JP | 2002-100606 A | | 4/2002 |
| JP | 2002-175975 A | | 6/2002 |
| JP | 2009-194239 A | | 8/2009 |
| JP | 2009-208055 A | | 9/2009 |
| JP | 2016-181641 A | | 10/2016 |
| JP | 2016181641 | * | 10/2016 |
| KR | 100576758 B1 | | 5/2006 |
| KR | 10-2008-0019416 A | | 3/2008 |
| KR | 2009-0012049 A | | 2/2009 |
| KR | 2009-0088808 A | | 8/2009 |
| KR | 20090088808 | * | 8/2009 |
| KR | 101261222 B1 | | 5/2013 |
| KR | 10-2017-0048787 A | | 5/2017 |

\* cited by examiner

*Primary Examiner* — Karen Kusumakar
(74) *Attorney, Agent, or Firm* — Harness, Dickey & Pierce, P.L.C.

(57) ABSTRACT

An apparatus for treating a substrate includes a heat treatment chamber having an interior space, a housing that is provided in the interior space and that has a treatment space therein, a gas supply line that supplies, into the treatment space, a hydrophobic gas for hydrophobicizing the substrate, and a decomposition unit that decomposes an alkaline gas leaking from the treatment space to the interior space.

17 Claims, 8 Drawing Sheets

APPARATUS FOR TREATING SUBSTRATE

CROSS-REFERENCE TO RELATED APPLICATIONS

A claim for priority under 35 U.S.C. § 119 is made to Korean Patent Application No. 10-2019-0068197 filed on Jun. 10, 2019, in the Korean Intellectual Property Office, the entire contents of which are hereby incorporated by reference.

BACKGROUND

Embodiments of the inventive concept described herein relate to an apparatus for treating a substrate, and more particularly, relate to a substrate treating apparatus for treating a substrate by supplying a gas to the substrate.

Among semiconductor manufacturing processes, a photo-lithography process is a process of forming a desired pattern on a wafer. The photo-lithography process is performed in spinner equipment to which exposing equipment is connected and that continuously performs a coating process, an exposing process, and a developing process. The spinner equipment sequentially performs a hexamethyldisilazane (hereinafter, referred to as HMDS) process, a coating process, a bake process, and a developing process. Here, the HMDS process is a process of dispensing HMDS onto the wafer before application of photo-resist (PR) so as to promote adhesion of the photo-resist to the wafer.

In general, in an HMDS process, a substrate is supported in a chamber in which the substrate is received, and a hexamethyldisilazane (HMDS) gas is supplied to the substrate. An alkaline gas such as ammonia is generated in a process in which the hexamethyldisilazane (HMDS) gas is supplied to the substrate to treat the substrate. The alkaline gas may be leaked to the outside when the substrate is loaded into or unloaded from the chamber. Therefore, an exhaust line is connected to the chamber, and the alkaline gas generated during the HMDS process is released through the exhaust line.

However, there is a limitation in exhaust pressure or exhaust volume provided by the exhaust line connected to the chamber. Therefore, the alkaline gas in the chamber may not be appropriately released. Furthermore, a gas flow in the chamber is changed when the exhaust pressure or the exhaust volume is adjusted to release the alkaline gas. Due to the gas flow change, a vortex may be generated in the chamber. Moreover, the alkaline gas is likely to collide with components in the chamber to generate particles. In addition, due to the gas flow change, treatment of the substrate by the HMDS gas may not be uniformly performed.

SUMMARY

Embodiments of the inventive concept provide a substrate treating apparatus for efficiently treating a substrate.

In addition, embodiments of the inventive concept provide a substrate treating apparatus for efficiently treating an alkaline gas.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a heat treatment chamber having an interior space, a housing that is provided in the interior space and that has a treatment space therein, a gas supply line that supplies, into the treatment space, a hydrophobic gas for hydrophobicizing the substrate, and a decomposition unit that decomposes an alkaline gas leaking from the treatment space to the interior space.

According to an embodiment, the housing may include a body having an open top side and a cover that covers the open top side of the body. The body and the cover may be combined with each other to form the treatment space, and the cover may vertically move to open or close the treatment space.

According to an embodiment, the heat treatment chamber may have an entrance/exit opening through which the substrate enters or exits the heat treatment chamber, and the apparatus may further include a door that opens or closes the entrance/exit opening.

According to an embodiment, the decomposition unit may include a photo-catalyst.

According to an embodiment, the photo-catalyst may be provided in a film form and may surround the housing.

According to an embodiment, the photo-catalyst may have a bar shape and may be disposed on a path along which the alkaline gas leaks from the treatment space to the interior space.

According to an embodiment, the decomposition unit may further include an irradiation member that irradiates light to the photo-catalyst.

According to an embodiment, the photo-catalyst may contain titanium dioxide ($TiO_2$).

According to an embodiment, the alkaline gas may be ammonia gas.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
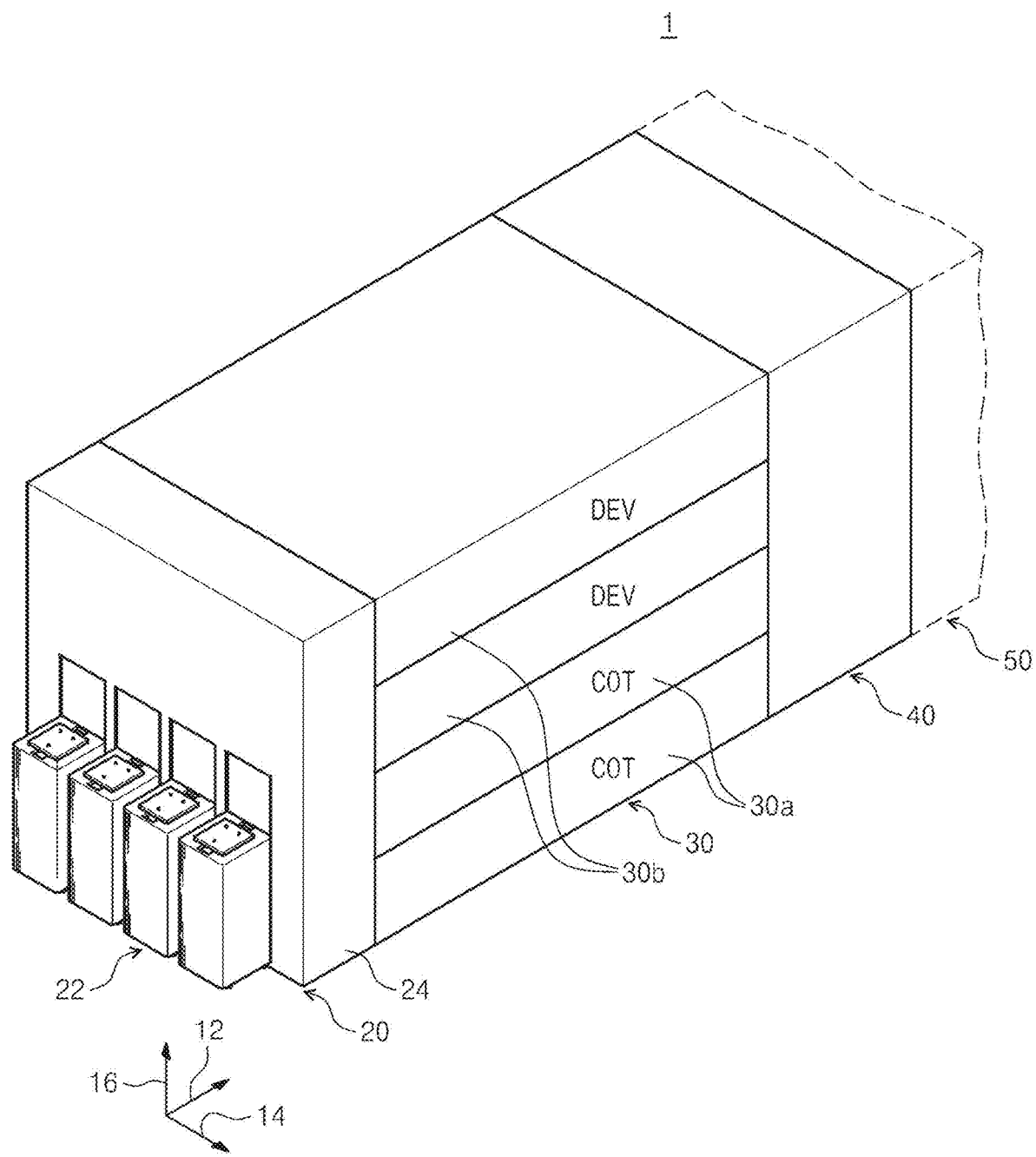
FIG. 1 is a schematic perspective view illustrating a substrate treating apparatus according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Figure 2:
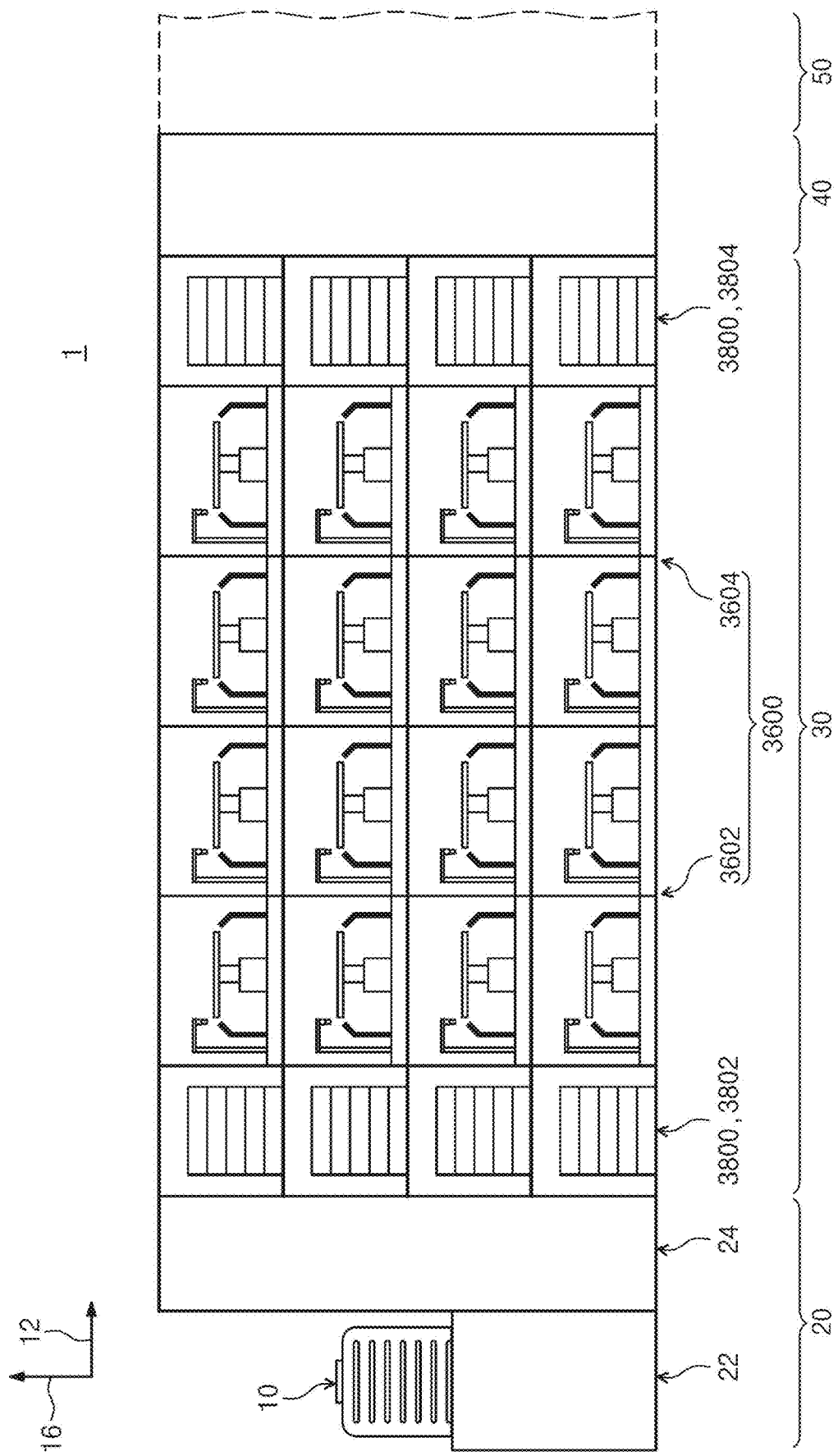
FIG. 2 is a sectional view illustrating coating blocks and developing blocks of the substrate treating apparatus of FIG. 1.
Figure 3:
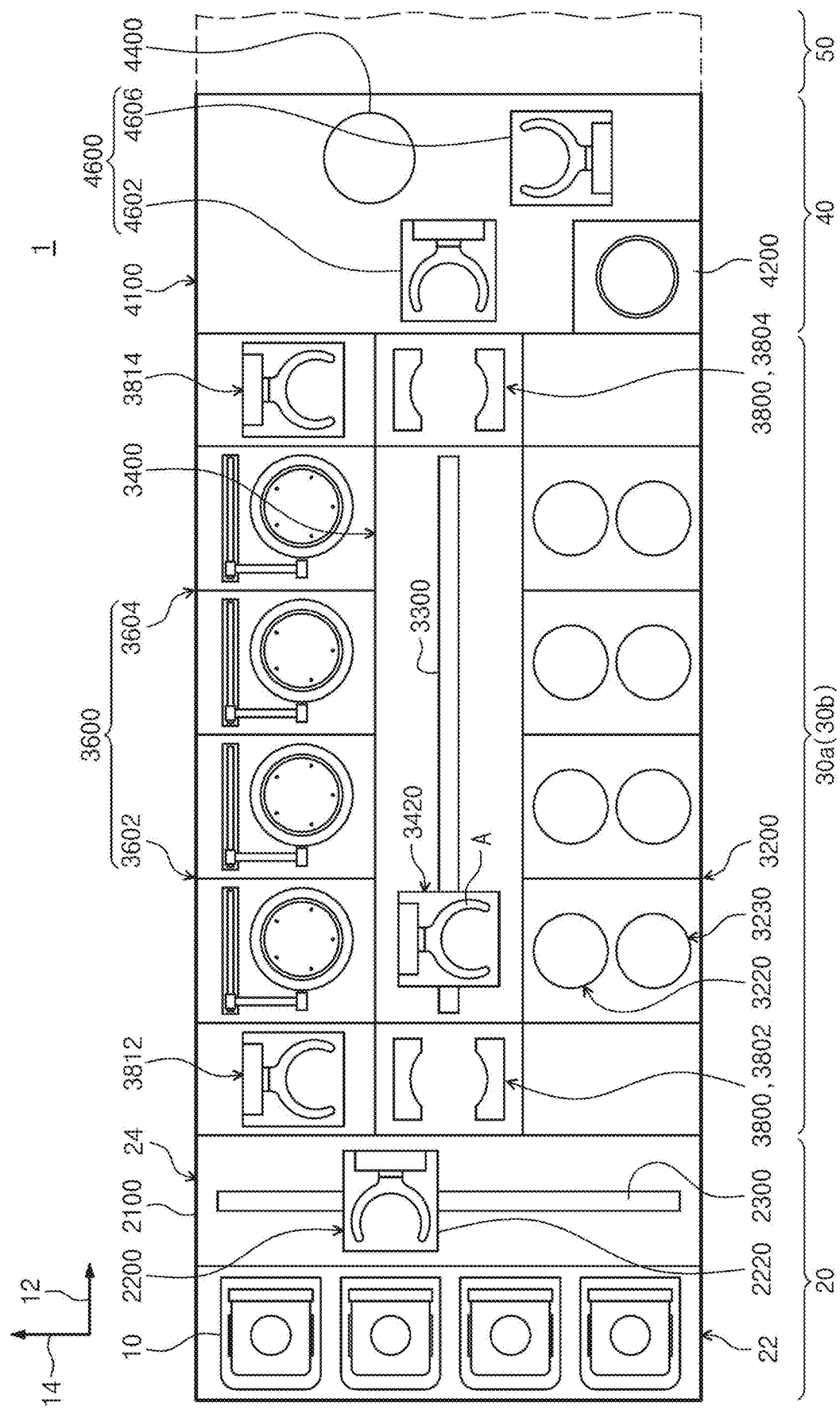
FIG. 3 is a plan view illustrating the substrate treating apparatus of FIG. 1.

FIG. 1 is a schematic perspective view illustrating a substrate treating apparatus according to an embodiment of the inventive concept. FIG. 2 is a sectional view illustrating coating blocks and developing blocks of the substrate treating apparatus of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as an X-axis direction 12, a direction perpendicular to the X-axis direction 12 when viewed from above is referred to as a Y-axis direction 14, and a direction perpendicular to both the X-axis direction 12 and the Y-axis direction 14 is referred to as a Z-axis direction 16.

The index module 20 transfers substrates W from carriers 10 having the substrates W received therein to the treating module 30 and places the completely treated substrates W in the carriers 10. The lengthwise direction of the index module 20 is parallel to the Y-axis direction 14. The index module 20 has load ports 22 and an index frame 24. The load ports 22 are located on the opposite side to the treating module 30 with respect to the index frame 24. The carriers 10 having the substrates W received therein are placed on the load ports 22. The load ports 22 may be disposed along the Y-axis direction 14.

Airtight carriers 10 such as front open unified pods (FOUPs) may be used as the carriers 10. The carriers 10 may be placed on the load ports 22 by a transfer unit (not illustrated) such as an overhead transfer, an overhead conveyor, or an automatic guided vehicle, or by an operator.

An index robot 2200 is provided in the index frame 24. A guide rail 2300, the lengthwise direction of which is parallel to the Y-axis direction 14, is provided in the index frame 24. The index robot 2200 is movable on the guide rail 2300. The index robot 2200 includes a hand 2220 on which the substrate W is placed, and the hand 2220 is movable forward and backward, rotatable about an axis facing in the Z-axis direction 16, and movable along the Z-axis direction 16.

The treating module 30 performs a coating process and a developing process on the substrate W. The treating module 30 has the coating blocks 30a and the developing blocks 30b. The coating blocks 30a perform the coating process on the substrate W, and the developing blocks 30b perform the developing process on the substrate W. The coating blocks 30a are stacked on each other. The developing blocks 30b are stacked on each other. According to the embodiment of FIG. 3, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 3, the coating blocks 30a have a heat treatment chamber 3200, a transfer chamber 3400, a liquid treatment chamber 3600, and a buffer chamber 3800. The heat treatment chamber 3200 performs a heat treatment process on the substrate W. The heat treatment process may include a cooling process and a heating process. The liquid treatment chamber 3600 forms a liquid film on the substrate W by dispensing a liquid onto the substrate W. The liquid film may be a photo-resist film or an anti-reflection film. The transfer chamber 3400 transfers the substrate W between the heat treatment chamber 3200 and the liquid treatment chamber 3600 in the coating blocks 30a.

The transfer chamber 3400 is provided such that the lengthwise direction thereof is parallel to the X-axis direction 12. A transfer unit 3420 is provided in the transfer chamber 3400. The transfer unit 3420 transfers the substrate W between the heat treatment chamber 3200, the liquid treatment chamber 3600, and the buffer chamber 3800. According to an embodiment, the transfer unit 3420 has a hand A on which the substrate W is placed, and the hand A is movable forward and backward, rotatable about an axis facing in the Z-axis direction 16, and movable along the Z-axis direction 16. A guide rail 3300, the lengthwise direction of which is parallel to the X-axis direction 12, is provided in the transfer chamber 3400. The transfer unit 3420 is movable on the guide rail 3300.

Figure 4:
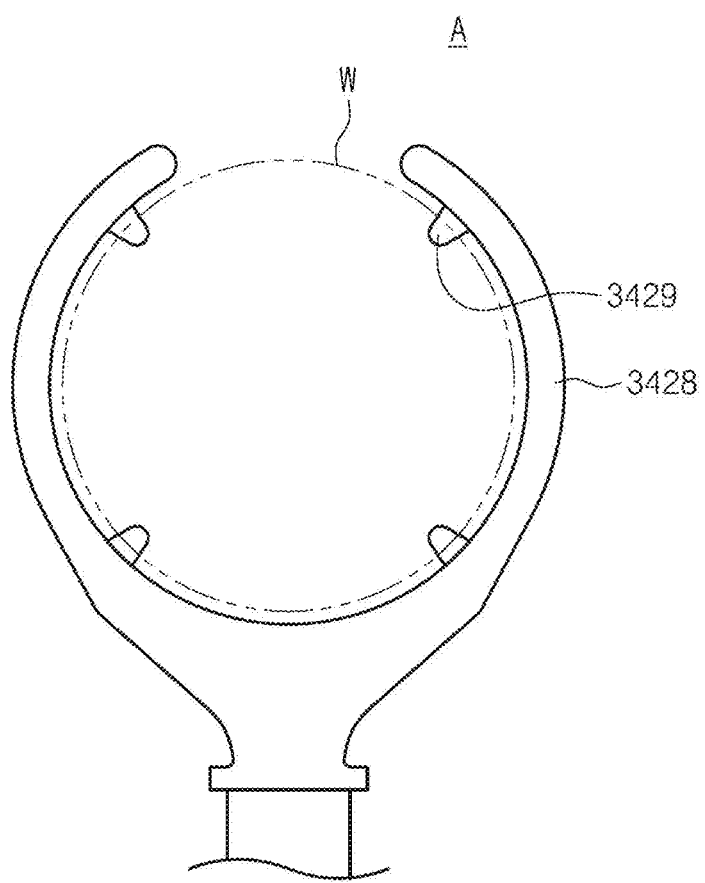
FIG. 4 is a view illustrating one example of a hand of a transfer unit of FIG. 3.

FIG. 4 is a view illustrating one example of the hand of the transfer unit of FIG. 3. Referring to FIG. 4, the hand A has a base 3428 and support protrusions 3429. The base 3428 may have an annular ring shape, the circumference of which is partly curved. The base 3428 has an inner diameter larger than the diameter of the substrate W. The support protrusions 3429 extend inward from the base 3428. The support protrusions 3429 support an edge region of the substrate W. According to an embodiment, four support protrusions 3429 may be provided at equal intervals.

Referring again to FIGS. 2 and 3, a plurality of heat treatment chambers 3200 are provided. The heat treatment chambers 3200 are disposed side by side along the X-axis direction 12. The heat treatment chambers 3200 are located on one side of the transfer chamber 3400.

Figure 5:
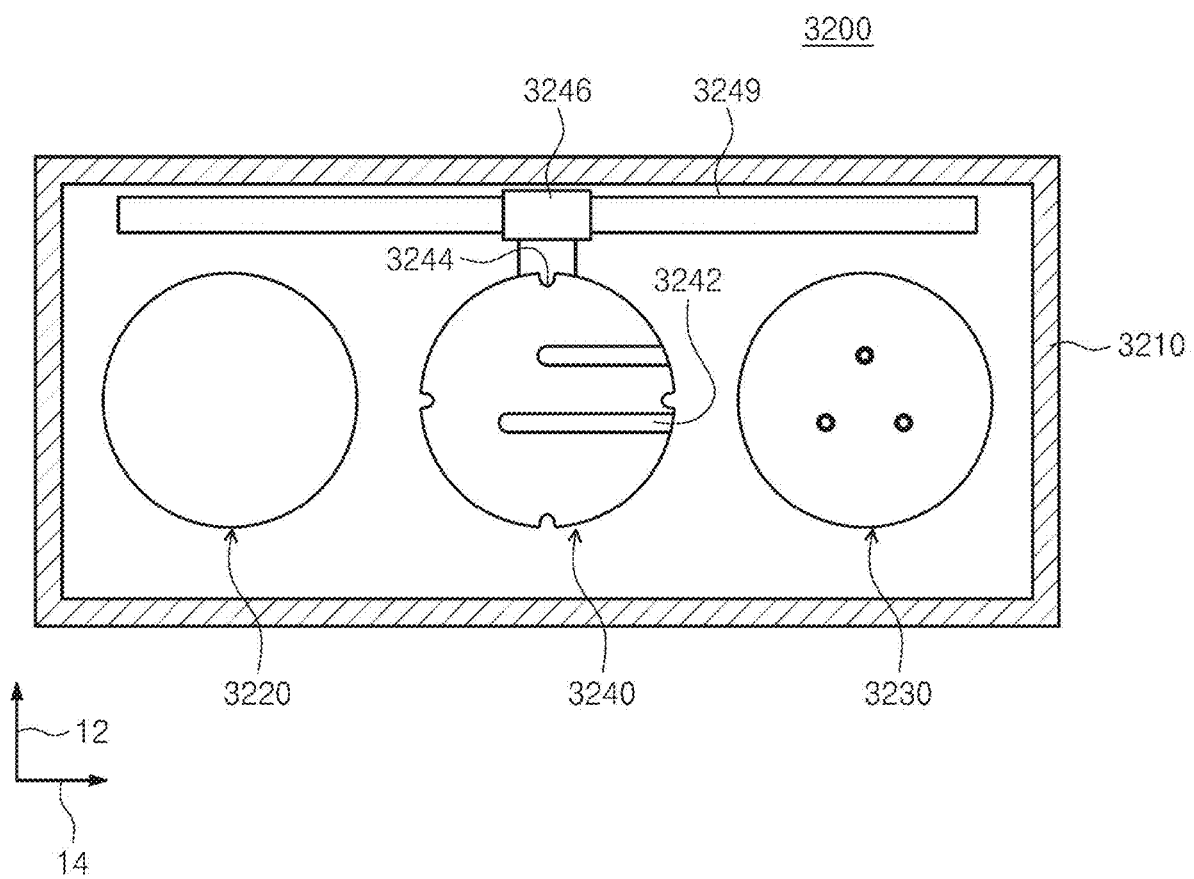
FIG. 5 is a schematic plan view illustrating one example of heat treatment chambers of FIG. 3.
Figure 6:
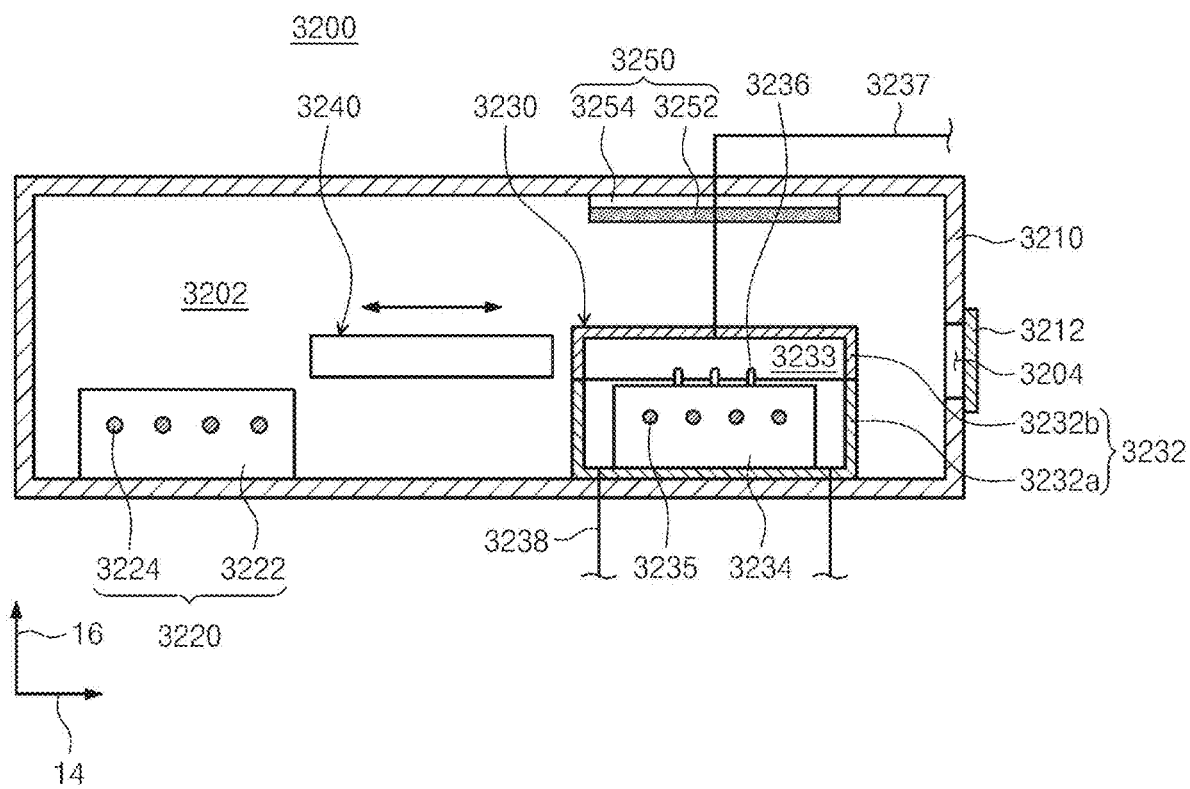
FIG. 6 is a front sectional view illustrating the heat treatment chamber of FIG. 5.

FIG. 5 is a schematic plan view illustrating one example of the heat treatment chambers of FIG. 3, and FIG. 6 is a front sectional view of the heat treatment chamber of FIG. 5. The heat treatment chamber 3200 has a housing 3210, a cooling unit 3220, a heating unit 3230, a transfer plate 3240, and a decomposition unit 3250.

The heat treatment chamber 3200 has an interior space 3202. The heat treatment chamber 3200 has a substantially rectangular parallelepiped shape. The heat treatment chamber 3200 has, in a sidewall thereof, an entrance/exit opening 3204 through which the substrate W enters or exits the heat treatment chamber 3200. Furthermore, a door 3212 may be provided to open or close the entrance/exit opening 3204. Selectively, the entrance/exit opening 3204 may be maintained in an open state. The cooling unit 3220, the heating unit 3230, the transfer plate 3240, and the decomposition unit 3250 are provided in the interior space 3202 of the heat treatment chamber 3200. The cooling unit 3220 and the heating unit 3230 are provided side by side along the Y-axis direction 14.

The cooling unit 3220 has a cooling plate 3222. The cooling plate 3222 may have a substantially circular shape when viewed from above. A cooling member 3224 is provided inside the cooling plate 3222. According to an embodiment, the cooling member 3224 may be formed inside the cooling plate 3222 and may serve as a fluid channel through which a cooling fluid flows.

The heating unit 3230 may include a housing 3232, a heating plate 3234, a heater 3235, a gas supply line 3237, and an exhaust line 3238. The housing 3232 may include a body 3232*a* and a cover 3232*b*. The body 3232*a* may have a shape that is open at the top. The body 3232*a* may have a cylindrical shape that is open at the top. The cover 3232*b* may cover the top of the body 3232*a*. The cover 3232*b* may have a cylindrical shape that is open at the bottom. Alternatively, the cover 3232*b* may have a plate shape that covers the top of the body 3232*a*. The body 3232*a* and the cover 3232*b* may be combined with each other to form a treatment space 3233. Furthermore, the cover 3232*b* may be connected with a drive member (not illustrated) that moves the cover 3232*b* in the vertical direction. Accordingly, the cover 3232*b* may vertically move to open or close the treatment space 3233. For example, when the substrate W is loaded into or unloaded from the treatment space 3233, the cover 3232*b* may move upward to open the treatment space 3233. Moreover, when the substrate W is treated in the treatment space 3233, the cover 3232*b* may move downward to close the treatment space 3233.

The heating plate 3234 may support the substrate W in the treatment space 3233. The heating plate 3234 has a substantially circular shape when viewed from above. The heating plate 3234 has a larger diameter than the substrate W. The heating plate 3234 is equipped with the heater 3235. The heater 3235 may be a resistance heating element to which electric current is applied. The heating plate 3235 has lift pins 3236 that are vertically movable along the Z-axis direction 16. The lift pins 3236 receive the substrate W from a transfer unit outside the heating unit 3230 and lay the substrate W down on the heating plate 3234, or raise the substrate W off the heating plate 3234 and transfer the substrate W to the transfer unit outside the heating unit 3230. According to an embodiment, three lift pins 3234 may be provided.

The gas supply line 3237 may supply a gas to the substrate W located in the treatment space 3233. The gas may be a hydrophobic gas that hydrophobicizes the substrate W. The hydrophobic gas may change the property of the substrate W from a hydrophilic property to a hydrophobic property. The hydrophobic gas may be supplied before the substrate W is coated with photo-resist (PR). The hydrophobic gas may include hexamethyldisilazane (HMDS). Furthermore, the hydrophobic gas may include an inert gas. For example, the inert gas may be nitrogen gas.

The exhaust line 3238 may evacuate the treatment space 3233. The exhaust line 3238 may reduce the pressure in the treatment space 3233. A plurality of exhaust lines 3238 may be provided. The plurality of exhaust lines 3238 may be connected to the bottom of the housing 3232. Furthermore, the plurality of exhaust lines 3238 may be spaced apart from each other at predetermined intervals. Moreover, the plurality of exhaust lines 3238 may be provided around the heating plate 3234. A pressure-reducing member (not illustrated) may be connected to the exhaust lines 3238. The pressure-reducing member may be a pump. Without being limited thereto, however, the pressure-reducing member (not illustrated) may include various well-known apparatuses capable of reducing the pressure in the treatment space 3233.

The transfer plate 3240 has a substantially circular plate shape and has a diameter corresponding to that of the substrate W. The transfer plate 3240 has notches 3244 formed at the edge thereof. The notches 3244 may have a shape corresponding to the protrusions 3429 formed on the hand A of the transfer unit 3420 described above. Furthermore, as many notches 3244 as the protrusions 3429, which are formed on the hand A, are formed in positions corresponding to the protrusions 3429. The substrate W is transferred between the hand A and the transfer plate 3240 when the vertical positions of the hand A and the transfer plate 3240 aligned with each other in the vertical direction are changed. The transfer plate 3240 is mounted on a guide rail 3249 and moved along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the Y-axis direction 14, and the guide grooves 3242 are located to be spaced apart from each other along the X-axis direction 12. The guide grooves 3242 prevent the transfer plate 3240 and the lift pins 3236 from interfering with each other when the substrate W is transferred between the transfer plate 3240 and the heating unit 3230.

The decomposition unit 3250 may decompose a gas that leaks from the treatment space 3233 to the interior space 3202. The gas decomposed by the decomposition unit 3250 may be an alkaline gas. The alkaline gas may be ammonia gas. Without being limited thereto, however, the decomposition unit 3250 may decompose various gases containing organic compounds. The decomposition unit 3250 may include a photo-catalyst 3252 and an irradiation member 3254.

The photo-catalyst 3252 may have a bar shape. The photo-catalyst 3252 may be provided over the heating unit 3230. For example, the photo-catalyst 3252 may be disposed over the heating unit 3230 so as to be adjacent to an inner wall of the heat treatment chamber 3200. For example, the irradiation member 3254 for irradiating light may be provided on the inner wall of the heat treatment chamber 3200, and the photo-catalyst 3252 may be provided on one surface of the irradiation member 3254.

The photo-catalyst 3252 may receive light irradiated by the irradiation member 3254. The photo-catalyst 3252 may contain a material that receives light energy and causes catalysis. That is, the photo-catalyst 3252 may cause a catalytic reaction (oxidation and reduction reactions) using light as an energy source and may generate a reactive substance through the catalytic reaction. The reactive substance may be reactive oxygen species. Furthermore, the photo-catalyst 3252 may contain titanium dioxide ($TiO_2$). The photo-catalyst 3252 may receive light irradiated by the irradiation member 3254, and holes on the surface of the photo-catalyst 3252 from which electrons escape may react with air or moisture in the treatment space 3233 to generate a reactive substance. The reactive substance may be a hydroxyl radical (R).

Figure 7:
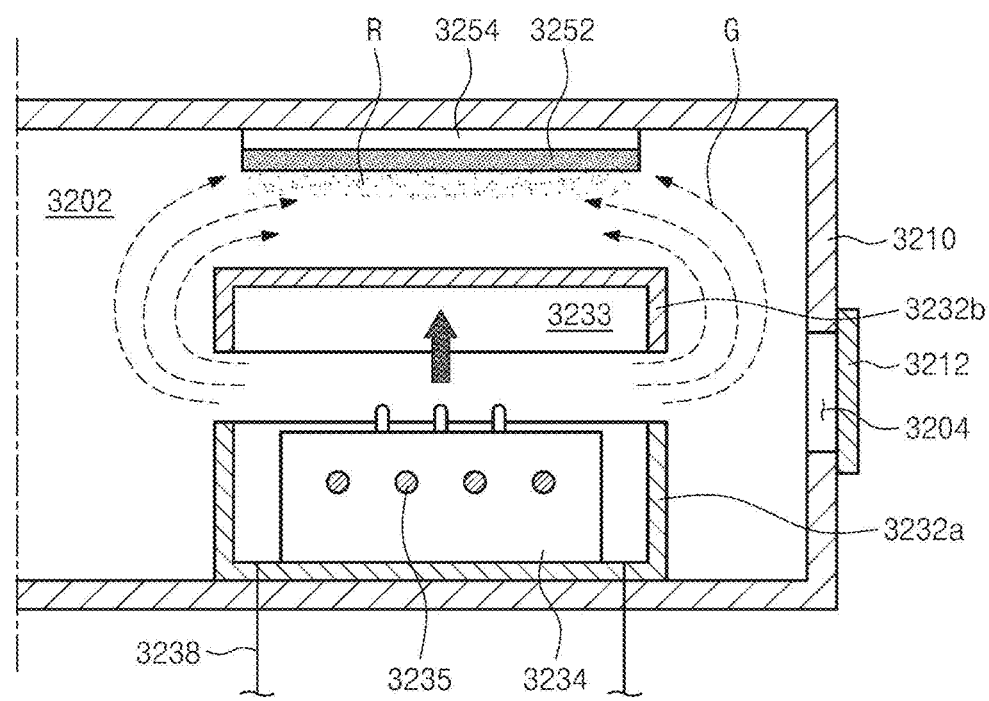
FIG. 7 is a view illustrating a state in which a heat treatment chamber according to an embodiment of the inventive concept decomposes an alkaline gas.

FIG. 7 is a view illustrating a state in which the heat treatment chamber according to the embodiment of the inventive concept decomposes an alkaline gas. Referring to FIG. 7, an alkaline gas G generated in a process of treating the substrate W by supplying a hydrophobic gas to the substrate W may remain in the treatment space 3233 of the housing 3232. When the substrate W is loaded into or unloaded from the treatment space 3233 of the housing 3232, the cover 3232b is raised by the drive member. At this time, the alkaline gas G remaining in the treatment space 3233 may leak from the treatment space 3233 to the interior space 3202. Furthermore, when the cover 3232b is raised, the irradiation member 3254 may irradiate light to the photo-catalyst 3252. As described above, the photo-catalyst 3252 may contain titanium dioxide ($TiO_2$). Accordingly, the photo-catalyst 3252 to which the light is irradiated may generate a reactive substance through a catalytic action. The reactive substance may be a hydroxyl radical (R). The hydroxyl radical R may react with the alkaline gas G that leaks from the treatment space 3232 to the interior space 3202. In a case where the alkaline gas G is ammonia gas, the chemical equation is as follows.

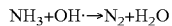

$$NH_3 + OH\cdot \rightarrow N_2 + H_2O$$

The alkaline gas G may be decomposed into water and an inert gas such as nitrogen by reacting with the reactive substance. In general, when an alkaline gas is released through an exhaust line connected to a chamber, the alkaline gas may not be appropriately released due to a limitation in exhaust volume or exhaust pressure. Furthermore, a gas flow in the chamber may be changed when the exhaust volume or the exhaust pressure is changed to effectively release the alkaline gas. The gas flow change may generate particles, or may hinder a substrate from being uniformly treated. Moreover, due to a limitation in a sealing technology for the chamber, it is difficult to completely prevent the alkaline gas from being leaked from the chamber. However, according to an embodiment of the inventive concept, the alkaline gas G leaking from the treatment space 3233 may be decomposed independently of evacuation of the treatment space 3233 through the exhaust line 3238 provided at the housing 3232. The alkaline gas G is decomposed into harmless substances such as water and nitrogen. In addition, there is no influence of the exhaust volume and the exhaust pressure of the exhaust line 3238 and a sealing technology for the housing 3232. Accordingly, an influence on treatment of the substrate W in the treatment space 3233 of the housing 3232 may be minimized.

Referring again to FIGS. 2 and 3, a plurality of buffer chambers 3800 are provided. Some of the buffer chambers 3800 are disposed between the index module 20 and the transfer chamber 3400. Hereinafter, these buffer chambers are referred to as the front buffers 3802. The front buffers 3802 are stacked on each other along the vertical direction. The other buffer chambers 3800 are disposed between the transfer chamber 3400 and the interface module 40. These buffer chambers are referred to as the rear buffers 3804. The rear buffers 3804 are stacked on each other along the vertical direction. The front buffers 3802 and the rear buffers 3804 temporarily store a plurality of substrates W. The substrates W stored in the front buffers 3802 are loaded or unloaded by the index robot 2200 and the transfer unit 3420. The substrates W stored in the rear buffers 3804 are loaded or unloaded by the transfer unit 3420 and a first robot 4602.

The developing blocks 30b have heat treatment chambers 3200, a transfer chamber 3400, and liquid treatment chambers 3600. The heat treatment chambers 3200, the transfer chamber 3400, and the liquid treatment chambers 3600 of the developing blocks 30b are disposed in a structure substantially similar to the structure in which the heat treatment chambers 3200, the transfer chamber 3400, and the liquid treatment chambers 3600 of the coating blocks 30a are disposed. Therefore, descriptions thereabout will be omitted. However, the liquid treatment chambers 3600 in the developing blocks 30b are provided as developing chambers 3600, all of which identically dispense a developing solution to perform a developing process on the substrate W.

The interface module 40 connects the treating module 30 with an external exposing apparatus 50. The interface module 40 has an interface frame 4100, an additional process chamber 4200, an interface buffer 4400, and a transfer member 4600.

The interface frame 4100 may have, at the top thereof, a fan filter unit that forms a downward air flow in the interface frame 4100. The additional process chamber 4200, the interface buffer 4400, and the transfer member 4600 are disposed in the interface frame 4100. Before the substrate W completely processed in the coating blocks 30a is transferred to the exposing apparatus 50, the additional process chamber 4200 may perform a predetermined additional process on the substrate W. Selectively, before the substrate W completely processed in the exposing apparatus 50 is transferred to the developing blocks 30b, the additional process chamber 4200 may perform a predetermined additional process on the substrate W. According to an embodiment, the additional process may be an edge exposing process of exposing an edge area of the substrate W to light, a top-side cleaning process of cleaning the top side of the substrate W, or a back-side cleaning process of cleaning the backside of the substrate W. A plurality of additional process chambers 4200 may be provided. The additional process chambers 4200 may be stacked on each other. The additional process chambers 4200 may all perform the same process. Selectively, some of the additional process chambers 4200 may perform different processes.

The interface buffer 4400 provides a space in which the substrate W transferred between the coating blocks 30a, the additional process chambers 4200, the exposing apparatus 50, and the developing blocks 30b temporarily stays. A plurality of interface buffers 4400 may be provided. The interface buffers 4400 may be stacked on each other.

According to an embodiment, the additional process chambers 4200 may be disposed on one side of an extension line facing in the lengthwise direction of the transfer chamber 3400, and the interface buffers 4400 may be disposed on an opposite side of the extension line.

The transfer member 4600 transfers the substrate W between the coating blocks 30a, the additional process chambers 4200, the exposing apparatus 50, and the developing blocks 30b. The transfer member 4600 may be implemented with one or more robots. According to an embodiment, the transfer member 4600 has the first robot 4602 and a second robot 4606. The first robot 4602 may transfer the substrate W between the coating blocks 30a, the additional process chambers 4200, and the interface buffers 4400. An interface robot 4606 may transfer the substrate W between the interface buffers 4400 and the exposing apparatus 50. The second robot 4606 may transfer the substrate W between the interface buffers 4400 and the developing blocks 30*b*.

Each of the first robot 4602 and the second robot 4606 includes a hand on which the substrate W is placed, and the hand is movable forward and backward, rotatable about an axis parallel to the Z-axis direction 16, and movable along the Z-axis direction 16.

Figure 8:
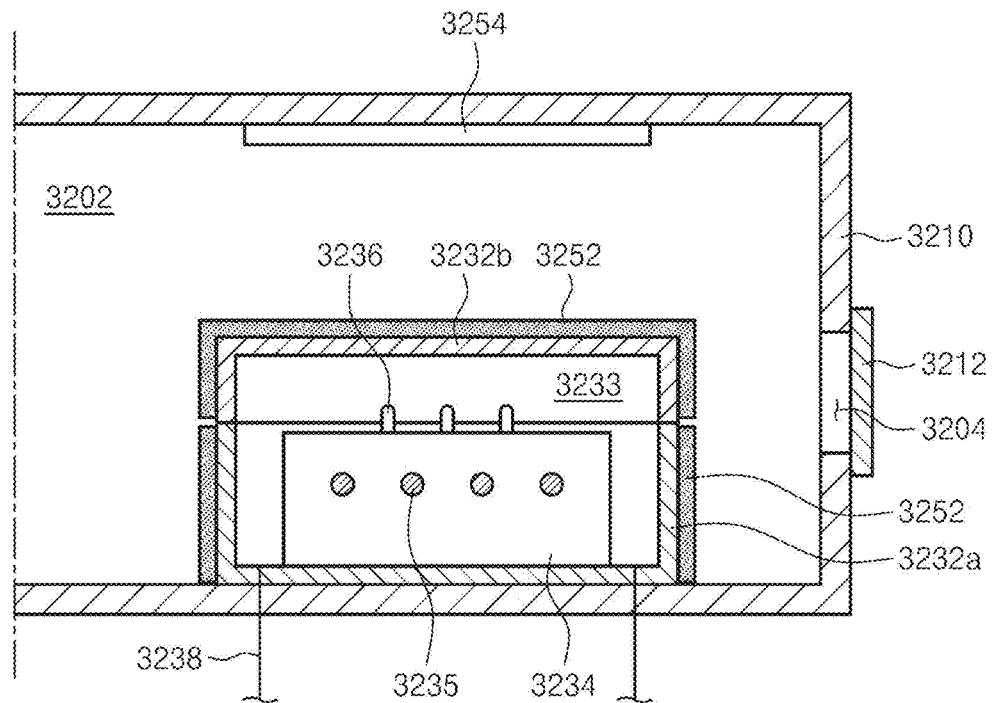
FIG. 8 is a view illustrating part of a heat treatment chamber according to another embodiment of the inventive concept.

In the above-described embodiments, it has been exemplified that the photo-catalyst 3252 is provided over the housing 3232. However, the inventive concept is not limited thereto. For example, as illustrated in FIG. 8, the photo-catalyst 3252 may be provided in the form of a film. The photo-catalyst 3252 provided in a film form may surround the housing 3232. In this case, the alkaline gas G leaking from the treatment space 3233 may be decomposed by immediately reacting with a reactive substance generated by the photo-catalyst 3252.

Figure 9:
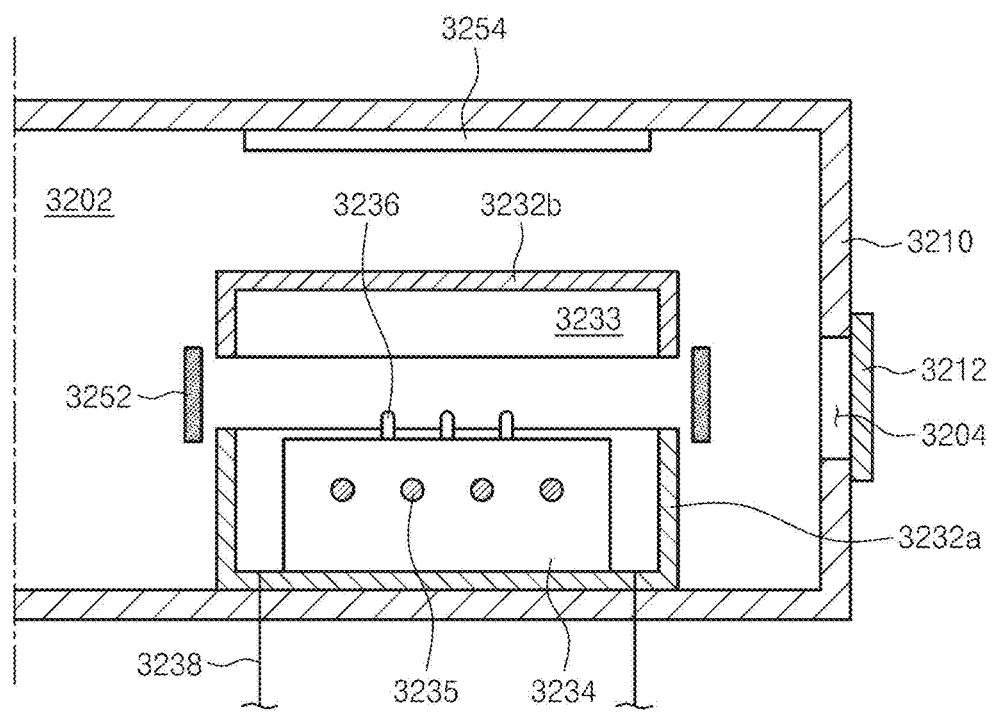
FIG. 9 is a view illustrating part of a heat treatment chamber according to another embodiment of the inventive concept.

In the above-described embodiment, it has been exemplified that the photo-catalyst 3252 is provided over the housing 3232. However, the inventive concept is not limited thereto. For example, as illustrated in FIG. 9, the photo-catalyst 3252 may be disposed on the path along which the alkaline gas G leaks from the treatment space 3233 to the interior space 3202. For example, in a case where the cover 3232*b* is raised off the body 3232*a*, the photo-catalyst 3252 may be disposed outside the area by which the body 3232*a* and the cover 3232*b* are spaced apart from each other. In this case, the photo-catalyst 3252 may have a ring shape when viewed from above. The photo-catalyst 3252 in a ring shape may have a larger radius than the housing 3232. Furthermore, the photo-catalyst 3252 in a ring shape may be coupled to a support member not illustrated. The photo-catalyst 3252 in a ring shape may be provided so as to be detachable from the support member.

Figure 10:
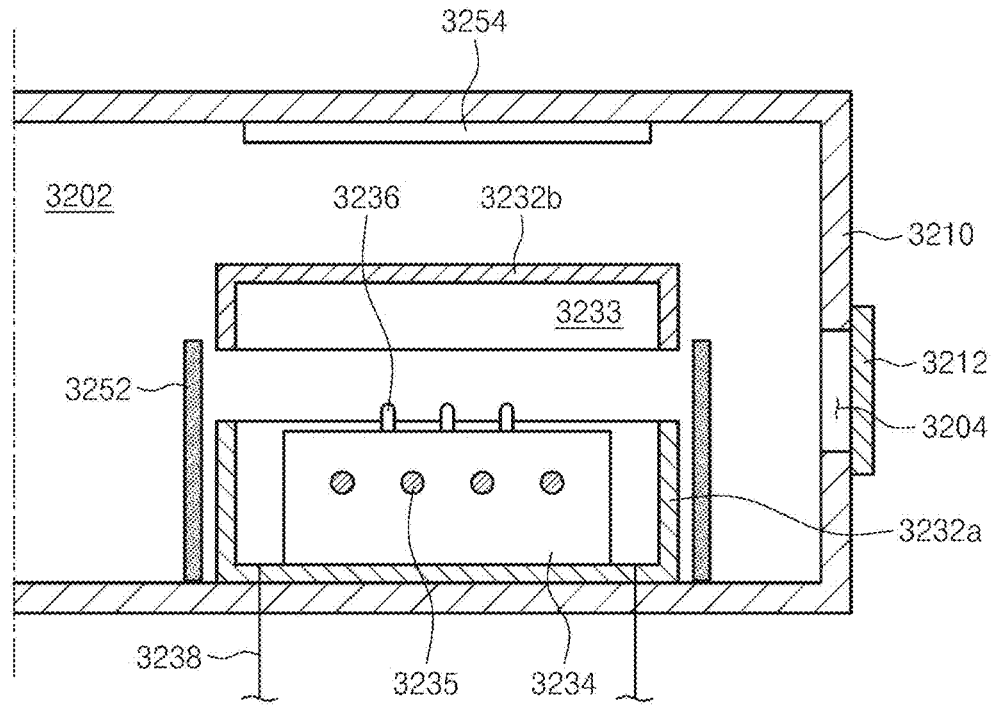
FIG. 10 is a view illustrating part of a heat treatment chamber according to another embodiment of the inventive concept.

Alternatively, as illustrated in FIG. 10, the photo-catalyst 3252 may have a cylindrical shape that is open at the top and the bottom. The photo-catalyst 3252 in a cylindrical shape with the open top and bottom may have a larger radius than the housing 3232. According to the embodiment illustrated in FIG. 10, as in the embodiment illustrated in FIG. 9, the photo-catalyst 3252 is disposed on the path along which the alkaline gas G leaks from the treatment space 3233 to the interior space 3202. Accordingly, efficiency in decomposing the alkaline gas G may be improved.

Figure 11:
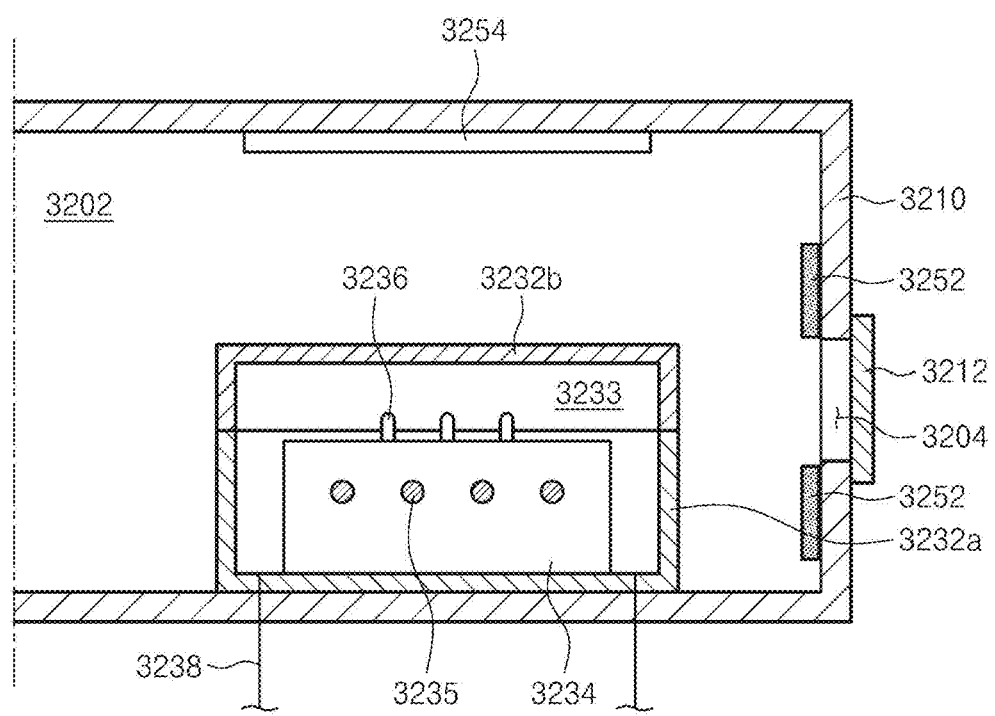
FIG. 11 is a view illustrating part of a heat treatment chamber according to another embodiment of the inventive concept.

In another case, as illustrated in FIG. 11, the photo-catalyst 3252 may be disposed adjacent to the entrance/exit opening 3204. The photo-catalyst 3252 may be provided on the inner wall of the heat treatment chamber 3200 and may have a shape surrounding the entrance/exit opening 3204. Because the entrance/exit opening 3204 is an opening through which the substrate W enters or exits the heat treatment chamber 3200, a gas flow is generated toward the entrance/exit opening 3204. Therefore, the alkaline gas G leaking from the treatment space 3233 to the interior space 3202 is easy to flow toward the entrance/exit opening 3204. Accordingly, in the case where the photo-catalyst 3252 is disposed adjacent to the entrance/exit opening 3204, efficiency in decomposing the alkaline gas G may be improved.

In the above-described embodiments, it has been exemplified that the single photo-catalyst 3252 is disposed. However, the inventive concept is not limited thereto. For example, the shapes and arrangements of the photo-catalysts 3252 described in the above embodiments may be used singly or in combination.

In the above-described embodiments, it has been exemplified that the irradiation member 3254 is provided separately from the photo-catalyst 3252. However, the inventive concept is not limited thereto. For example, the irradiation member 3254 may be omitted. Alternatively, the irradiation member 3254 may be integrated with the photo-catalyst 3252.

In the above-described embodiments, it has been exemplified that the process gas is an HMDS gas and the substrate treating process is a process of hydrophobicizing the substrate W before the substrate W is coated with photo-resist. However, the substrate treating process may be a different process from the aforementioned process. For example, the substrate treating process may be a deposition process of forming a thin film on the substrate W or an etching process of removing a film on the substrate W.

As described above, according to the embodiments of the inventive concept, the substrate treating apparatus may efficiently treat a substrate.

In addition, the substrate treating apparatus may efficiently treat an alkaline gas.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a heat treatment chamber having an interior space;
    a housing provided in the interior space, the housing having a treatment space therein;
    a gas supply line configured to supply, into the treatment space, a hydrophobic gas for hydrophobicizing the substrate; and
    a decomposition unit configured to decompose an alkaline gas leaking from the treatment space to the interior space,
    wherein the housing includes,
        a body having an open top side, and a cover configured to cover the open top side of the body, wherein the body and the cover are combined with each other to form the treatment space, and wherein the cover vertically moves to open or close the treatment space.

2. The apparatus of claim 1, wherein the heat treatment chamber has an entrance/exit opening through which the substrate enters or exits the heat treatment chamber, and wherein the apparatus further comprises a door configured to open or close the entrance/exit opening.

3. The apparatus of claim 1, wherein the decomposition unit includes a photo-catalyst.

4. The apparatus of claim 3, wherein the photo-catalyst is provided in a film form and is configured to surround the housing.

5. The apparatus of claim 3, wherein the photo-catalyst has a bar shape.

6. The apparatus of claim 5, wherein the decomposition unit further includes an irradiation member configured to irradiate light to the photo-catalyst.

7. The apparatus of claim 6, wherein the irradiation member is provided on an inner wall of the heat treatment chamber and the photo-catalyst is provided on one surface of the irradiation member.

8. The apparatus of claim 3, wherein the photo-catalyst is disposed on a path along which the alkaline gas leaks from the treatment space to the interior space.

9. The apparatus of claim 3, wherein the photo-catalyst is provided on an inner wall of the heat treatment chamber.

10. The apparatus of claim 9, wherein the photo-catalyst has a shape surrounding an entrance/exit opening.

11. The apparatus of claim 3, wherein the photo-catalyst contains titanium dioxide ($TiO_2$).

12. The apparatus of claim 1, wherein the alkaline gas is ammonia gas.

13. An apparatus for treating a substrate, the apparatus comprising:

a heat treatment chamber having an interior space;

a housing provided in the interior space, the housing having a treatment space therein;

a gas supply line configured to supply, into the treatment space, a hydrophobic gas for hydrophobizing the substrate, and a decomposition unit configured to decompose an alkaline gas leaking from the treatment space to the interior space, wherein the decomposition unit includes a photo-catalyst, and wherein the photo-catalyst has a ring shape.

14. The apparatus of claim 13, wherein the photo-catalyst is coupled to a support member.

15. The apparatus of claim 14, wherein the photo-catalyst is provided so as to be detachable from the support member.

16. An apparatus for treating a substrate, the apparatus comprising:

a heat treatment chamber having an interior space;

a housing provided in the interior space, the housing having a treatment space therein;

a gas supply line configured to supply, into the treatment space, a hydrophobic gas for hydrophobicizing the substrate; and a decomposition unit configured to decompose an alkaline gas leaking from the treatment space to the interior space, wherein the decomposition unit includes a photo-catalyst, and wherein the photo-catalyst has a cylindrical shape that is open at a top and a bottom.

17. The apparatus of claim 16, wherein the photo-catalyst has a lager radius than the housing.

* * * * *